United States Patent
Tokunaga

(10) Patent No.: US 7,643,302 B2
(45) Date of Patent: Jan. 5, 2010

(54) ELECTRONIC DEVICE, PACKAGE HAVING THE SAME, AND ELECTRONIC APPARATUS

(75) Inventor: Kenji Tokunaga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/121,444

(22) Filed: May 15, 2008

(65) Prior Publication Data

US 2008/0218965 A1 Sep. 11, 2008

Related U.S. Application Data

(63) Continuation of application No. PCT/JP2005/021053, filed on Nov. 16, 2005.

(51) Int. Cl.
H05K 7/20 (2006.01)

(52) U.S. Cl. .................... 361/719; 257/713; 361/704

(58) Field of Classification Search ............ None
See application file for complete search history.

(56) References Cited

U.S. PATENT DOCUMENTS

| | | | | |
|---|---|---|---|---|
| 5,831,825 A * | 11/1998 | Fromont | .................... | 361/719 |
| 6,301,114 B1 * | 10/2001 | Ootani | .................... | 361/704 |
| 6,525,942 B2 * | 2/2003 | Huang et al. | .................... | 361/704 |
| 6,528,882 B2 * | 3/2003 | Ding et al. | .................... | 257/738 |
| 6,552,907 B1 * | 4/2003 | Caldwell | .................... | 361/708 |
| 6,657,311 B1 * | 12/2003 | Hortaleza et al. | .................... | 257/778 |
| 6,657,864 B1 * | 12/2003 | Dyckman et al. | .................... | 361/704 |
| 6,753,600 B1 * | 6/2004 | Ho | .................... | 257/698 |
| 6,867,493 B2 * | 3/2005 | Hashemi et al. | .................... | 257/717 |
| 7,049,696 B2 * | 5/2006 | Kubo | .................... | 257/706 |
| 7,061,100 B2 * | 6/2006 | Iwaki et al. | .................... | 257/706 |
| 7,148,554 B2 * | 12/2006 | Nah et al. | .................... | 257/532 |
| 7,161,239 B2 * | 1/2007 | Zhao et al. | .................... | 257/707 |
| 7,269,017 B2 * | 9/2007 | Berlin et al. | .................... | 361/719 |
| 2004/0031004 A1 | 2/2004 | Yoshioka | | |

FOREIGN PATENT DOCUMENTS

| | | |
|---|---|---|
| JP | 3-278539 A | 12/1991 |
| JP | 8-213520 A | 8/1996 |
| JP | 2000-306998 A | 11/2000 |
| JP | 2000-323525 A | 11/2000 |
| JP | 2002-110902 A | 4/2002 |
| JP | 2003-17494 A | 1/2003 |
| JP | 2004-072017 A | 3/2004 |
| JP | 2005-158777 A | 6/2005 |

OTHER PUBLICATIONS

International Search Report of PCT/JP2005/021053, date of mailing Dec. 20, 2005.

* cited by examiner

*Primary Examiner*—Boris L Chervinsky
(74) *Attorney, Agent, or Firm*—Westerman, Hattori, Daniels & Adrian, LLP

(57) ABSTRACT

There is provided an electronic device that includes a circuit element that transmits a signal to an external board and receives the signal from the external board, a signal wire that connects the external board to the circuit element, and a heat radiation wire that thermally contacts the circuit element, and radiates heat from the circuit element.

10 Claims, 8 Drawing Sheets

ELECTRONIC DEVICE, PACKAGE HAVING THE SAME, AND ELECTRONIC APPARATUS

CROSS-REFERENCE TO RELATED APPLICATIONS

This application is a continuation claiming a foreign priority benefit based on PCT/JP2005/21053, filed on Nov. 16, 2005, which is hereby incorporated by reference herein in its entirety as if fully set forth herein.

BACKGROUND OF THE INVENTION

The present invention relates generally to an electronic apparatus that houses a circuit element, such as an LSI, and more particularly to a heat radiation structure for the circuit element that generates heat when it is operating. The present invention is suitable, for example, for heat radiations for LSI chips in a wide variety of packages, such as a ball grid array ("BGA"), a land grid array ("LGA"), and a pin grid array ("PGA").

Along with recently widespread, small and sophisticated electronic apparatuses, a supply of an electronic apparatus that realizes high density mounting is increasingly demanded. In order to meet this demand, a BGA package is conventionally proposed. In general, the BGA package is one type of a package that is soldered to a printed board (also referred to as a "system board" or a "motherboard"), and is mounted with an IC or an LSI that generally serves as a CPU. The BGA package realizes a narrow pitch and multiple pins (many leads), and provides a sophisticated electronic apparatus through a higher density package.

As the CPU's performance improves, the heating value of the CPU increases and, in order to thermally protect the CPU, a cooling device called a heat sink is thermally connected to the CPU via a heat spreader. The heat sink includes cooling fins, stands close to the CPU, and radiates heat from the CPU through natural cooling.

FIG. 7 shows a schematic section of a conventional LSI chip 10 housed in a package. The LSI chip 10 includes transistors 12, each of which serves as an exoergic circuit element, and is mounted on a corresponding one of connectors 14 on a substrate 11. The connector 14 is connected to one or more signal wires (including a power supply wire) 16. Each signal wire 16 is connected to a corresponding one of bumps 18. The bump 18 is connected to an external board, and the transistor 12 is electrically connected to the external board via the signal wires 16 and the bumps 18. The substrate 11 contacts a heat spreader (not shown) via a top surface of the package. Thus, the conventional LSI chip 10 radiates heat only from the substrate 11's surface side, as shown in FIG. 8, and does not radiate the heat from the bumps 18 side.

Other prior art relating to the heat radiation include, for example, Japanese Patent Applications Nos. 2002-11902, 2000-323525, and 2003-17494.

The heating value has recently increased with a higher operational frequency of the transistor and higher density mounting. In general, as the temperature of a CMOS transistor rises, the mobility of electrons (holes) in a channel lowers and the performance of the CMOS transistor degrades. On the other hand, the substrate is too thick to improve the heat radiation efficiency. In particular, in the SOI technology, the heat radiation by the self-heating substrate is insufficient. In addition, a Low-k interlayer film material, such as SiLK, which is used to reduce the wiring parasitic capacity, contains air bubbles in its inside, and exhibits poor heat conductions. As a result, as shown in FIG. 8, the heat exhausts near the transistor become insufficient.

BRIEF SUMMARY OF THE INVENTION

The present invention is directed to an electronic device having better heat radiation efficiency, a package having the same, and an electronic apparatus.

According to one aspect of the present invention an electronic device include a circuit element that transmits a signal to an external board and receives the signal from the external board, a signal wire that connects the external board to the circuit element, and a heat radiation wire that thermally contacts the circuit element, and radiates heat from the circuit element. This electronic device uses the heat radiation wire to protect the circuit element from thermal damages, and to maintain the electric characteristic. Therefore, this electronic device can use of a Low-k interlayer film material, and a higher operational frequency. The heat radiation wire may be electrically insulated from the circuit element. Thereby, the heat radiate wire can prevent degradations of the electric characteristic of the circuit element.

The heat radiation wire may be electrically isolated from the circuit element. The electronic device may further include a bump that is connectible to the external board, wherein the heat radiation wire is thermally connected to the bump. In this case, the bump serves as a thermal exhaust port. The electronic device may further include plural bumps that are connectible to the external board, wherein the signal wire and the heat radiation wire are connected to different bumps among the plural bumps. Use of different bumps prevents degradations of the electric characteristic of the circuit element. Use of the bump that is inherently provided on the chip does not increase the number of components, and maintains the size of the chip.

The heat radiation wire may be made of a metallic material having a high thermal conductivity, such as cupper and aluminum. When the heat radiation wire is made of the same material as that of the signal wire, the same machine can form both the signal wires and the heat radiation wires as dummy wires. The heat radiation wire may have the same diameter as that of the signal wire. It is conceivable to make a diameter of the heat radiation wire greater than that of the signal wire so as to enhance the heat radiation efficiency, but this configuration would increase the size of the chip. However, the present invention allows the diameter of the heat radiation wire to be greater than the signal wire, when the large size of the chip is permissible or when the enhanced heat radiation efficiency is highly required.

The heat radiation wire may have a part that is spaced from the circuit element and extends parallel to a surface of the circuit element. Spacing from the circuit element can prevent the heat radiation wire from deteriorating the electric characteristic of the circuit element. A parallel arrangement to the surface of the circuit element rather than a perpendicular arrangement to the surface of the circuit element enables the heat radiation wire to uniformly receive the heat from the circuit element in a direction in which the heat radiation wire extends.

The electronic device may further include a dispersion member that is connected to the heat radiation wire, and disperses heat from the heat radiation wire. The dispersion member is, for example, a meshed member. The dispersion member can make the heat radiation efficiency uniform in the electronic device plane. The mesh structure permits the signal wires to pass through it, and a plate may be used instead of the mesh in an area that has no signal wires. The dispersion member may be formed in a wiring layer farthest from the circuit element among wiring layers of the signal wire. Thereby, the heat radiation efficiency in the final layer can be made uniform in the electronic device plane.

The heat exhaust port for the heat radiation wire is not limited to the bump. For example, an electronic device may further include a substrate that is mounted with the circuit element, and radiates heat from the circuit element, and a heat conductor that perforates the substrate, and is connected to the heat radiation wire. Moreover, the heat radiation wire may extend perpendicular to a lamination direction of the signal wire, and expose to outside.

A circuit package according to another aspect of the present invention includes an electronic device that includes a circuit element, and a heat radiation wire that thermally contacts and radiates heat from the circuit element, a substrate that is mounted with the circuit element, and electrically connected to the circuit element, and a pin provided onto the substrate and electrically connected to an external board. This circuit package can exhibit the operation of the above electronic device. The circuit package may further include a heat conductor that is thermally connected to the electronic device, and leads the heat that is generated from the electronic device to the external board. The heat conductor effectuates the heat exhausts. The heat conductor may use natural cooling, such as a heat sink, or compulsory cooling, such as a heat pipe and a cooling fan.

An electronic apparatus according to still another aspect of the present invention includes an electronic device that includes a circuit element, a heat radiation wire that radiates heat generated from the circuit element, and a signal wire that is electrically connected to the circuit element, and a circuit board mounted with and electrically connected to the outside. This circuit package can exhibit the operation of the above electronic device.

Other aspects of the present invention will become apparent from the following description and the attached drawings.

DETAILED DESCRIPTION OF THE PREFERRED EMBODIMENTS

Figure 1:
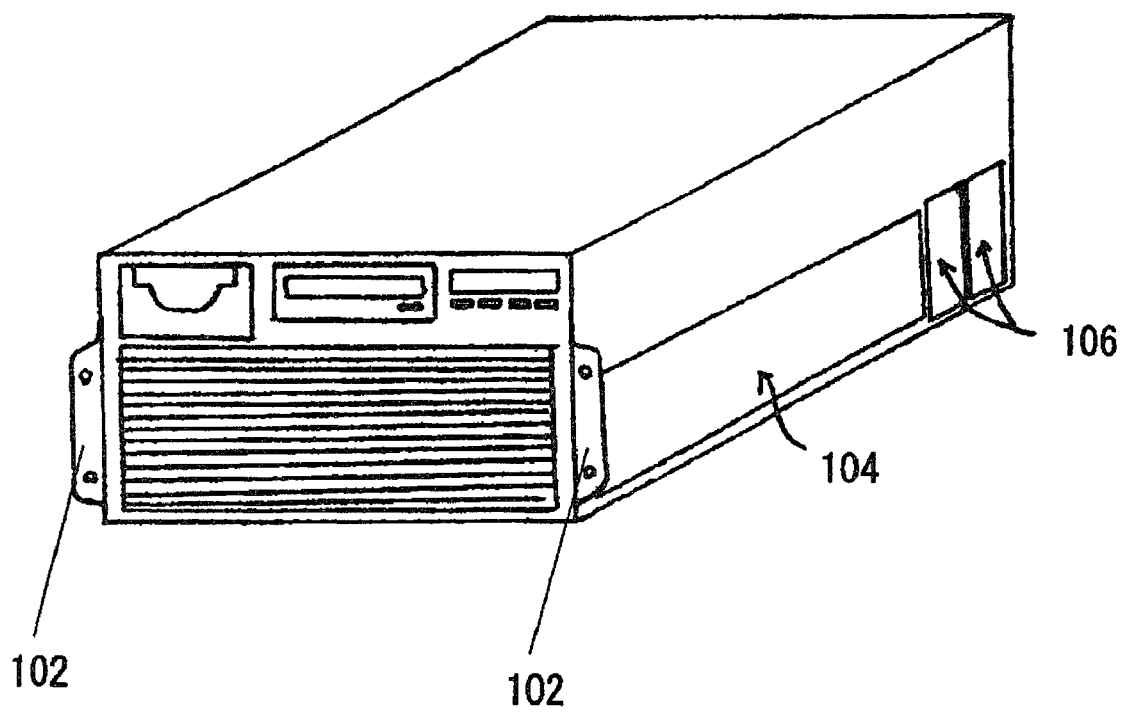
FIG. 1 is a schematic perspective view of an electronic apparatus according to the present invention.

Referring now to the accompanying drawings, a description will be given of an electronic apparatus 100 according to one embodiment of the present invention. Here, FIG. 1 is a schematic perspective view of the electronic apparatus 100. As shown in FIG. 1, the electronic device 100 is implemented as a rack-mount type UNIX server. The electronic device 100 is screwed on a rack (not shown) by a pair of attachment parts 102, and mounted with a printed board 110 shown in FIGS. 2A-2C in a housing 104. The housing 104 has a fan module 106, in which a built-in cooling fan rotates to generate the airflow and compulsorily cools a built-in heat sink.

The printed board 110 includes a package (electronic component) 120, plural block plates (not shown), into which a memory card is to be inserted, and one or more connectors (not shown) for use with external units, such as a hard disc drive ("HDD") and a LAN. The package 120 can use any one of a BGA, an LGA, and a PGA.

Figures 2A, 2B, 2C:
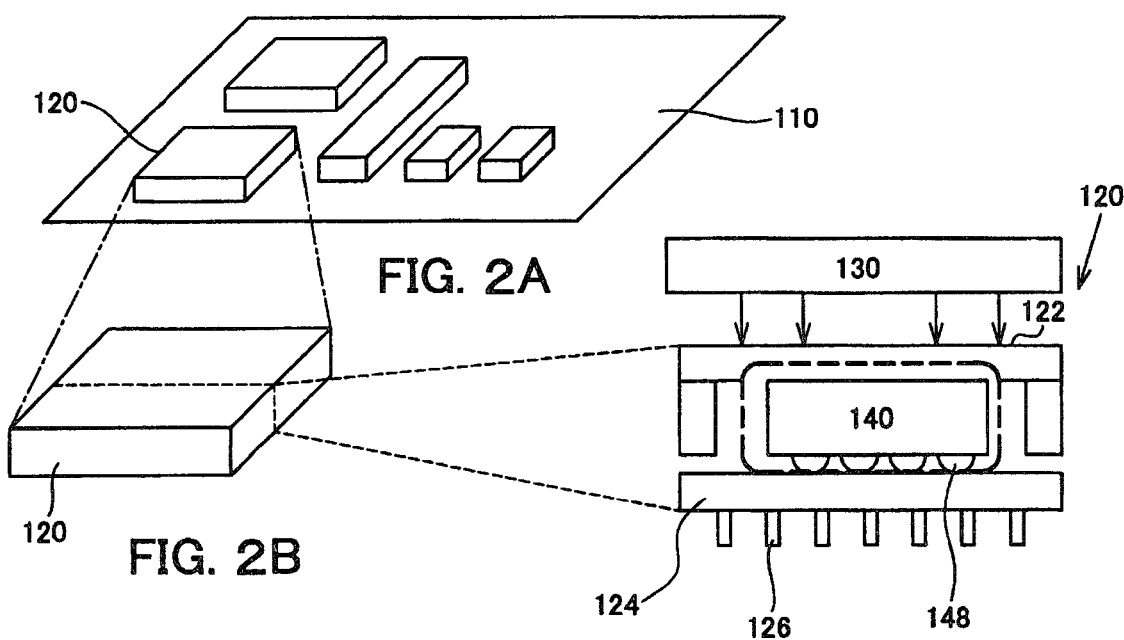
FIG. 2A is a schematic perspective view of a printed board mounted with a package configured to house an LSI chip according to the present invention.
FIG. 2B is a schematic perspective view of the package.
FIG. 2C is a schematic sectional view of the package taken along a dotted line shown in FIG. 2B.

FIG. 2A is a schematic perspective view of the printed board 110 mounted with the package 120 (which is a CPU package in an example) configured to house an LSI chip of this embodiment. FIG. 2B is a schematic perspective view of the package 120. FIG. 2C is a schematic sectional view of the package 120 taken along a dotted line shown in FIG. 2B. As shown in FIG. 2C, the package 120 houses the LSI chip 140. While the package 120 of this embodiment is a single chip type that is mounted with one LSI chip 140, but the present invention does not exclude a multi-chip type package.

The package 120 has a substrate 124, on which the LSI chip 140 is mounted. Electrodes connectable to bumps of the LSI chip 140 are formed on a top surface of the substrate 124 as illustrated, and the bump and the electrode are electrically connected to each other. Since the substrate 124 may have a dummy electrode that does not contribute to an electric connection, all the bumps and electrodes do not have to be electrically connected to each other. Plural input/output (I/O) pins 126 connectable to the printed board 110 are formed on a bottom surface of the substrate as illustrated.

The package 120 contacts a heat spreader 130 through a top surface 122 of the package 120 as shown in FIG. 2C. The heat generated from the LSI chip 140 transmits to the heat spreader 130 via the package's top surface 122. The heat spreader 130 serves to transmit the heat from the LSI chip 140 to a heat sink (not shown), and is made of a material having high thermal conductivity, such as AlN and Cu. A thermal grease or thermal sheet having a high thermal conductivity may be filled in between the heat spreader and the LSI chip 140. In compressing the heat spreader 130 against the package 120, a member, such as a stiffener, may be interposed.

The heat sink (not shown) has a base and many cooling fins. The base is a plate composed of a material having a high thermal conductivity, such as aluminum, copper, aluminum nitride, artificial diamond, and plastic, and joined with the heat spreader 130. The heat sink is manufactured by sheet metal working, aluminum die casting, or other processes, and if it is made of plastic, it may be formed, for example, by injection molding. The cooling fin has an arbitrary shape, such as a plate shape and a pin shape, to maintain a heat radiation area. An arrangement of the fins and the number of fins are arbitrary and each fin is made of a material having a high thermal conductivity.

Figure 3:
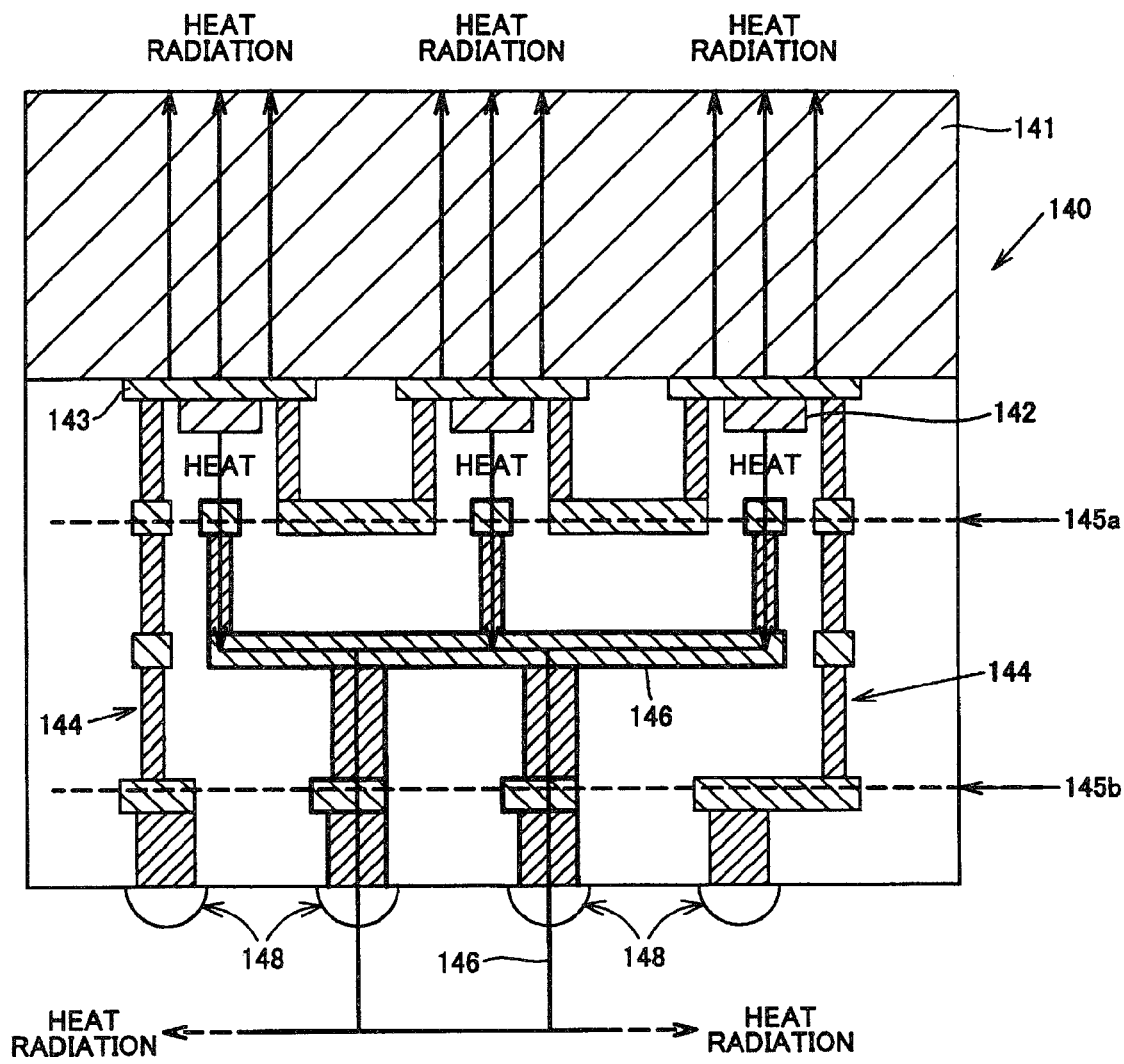
FIG. 3 is a schematic enlarged sectional view of the LSI chip shown in FIGS. 2A-2C.

FIG. 3 is a schematic enlarged sectional view of the LSI chip 140. The LSI chip 140 includes plural transistors 142, each of which is mounted on a corresponding one of connectors 143 on a substrate 141. In the LSI chip 140 shown in FIG. 3, signal wires are formed by multilayered wires. Each connector 143 is connected to one or more signal wires 144 including a power supply wire, and each signal wire 144 is connected to a bump 148 that serves as an LSI I/O terminal. The signal wire 144 is made of a metallic wire that constitutes a network that connects inputs and outputs of the transistor 142. The bumps 148 are connected to an external board via wires of the package 120, and the transistor 142 is electrically connected to the external board via the signal wires 144 and the bumps 148. The substrate 141 that serves as an LSI substrate contacts the heat spreader 130 via the top surface 122 of the package 120 as illustrated.

The LSI chip 140 further includes one or more heat radiation wire or dummy wires 146 that serve as heat radiation wires. The heat radiation wire 146 is made by an approach similar to the signal wire 144. The heat radiation wires 146 constitute a dedicated thermal conduction network independent of the electric transistor network. The heat radiation wires 146 are at least partially provided between wiring layers 145a and 145b of the signal wire 144, are electrically insulated from the transistor 142, and radiate heat from the transistor 142.

In FIG. 3, the wiring layer 145a is the lowermost wiring layer nearest the transistor 142, the wiring layer 145b is the uppermost layer, and there can be plural wiring layers between them. Since the heat radiation wire 146 is provided in the wiring layer, the heat radiation efficiency is higher than that of the heat radiation structure that radiates the heat outside the LSI chip as in Japanese Patent Applications Nos. 2002-11902, 2000-323525, and 2003-17494.

In order to prevent degradations of the electric characteristic of the transistor, the transistor 142 is insulated from the heat radiation wires 146. When the heat radiation wire 146 is made of a metallic line, the transistor 142 is spaced from the heat radiation wire 146. When the heat radiation wire 146 is an insulator, both can contact each other.

Figure 5:
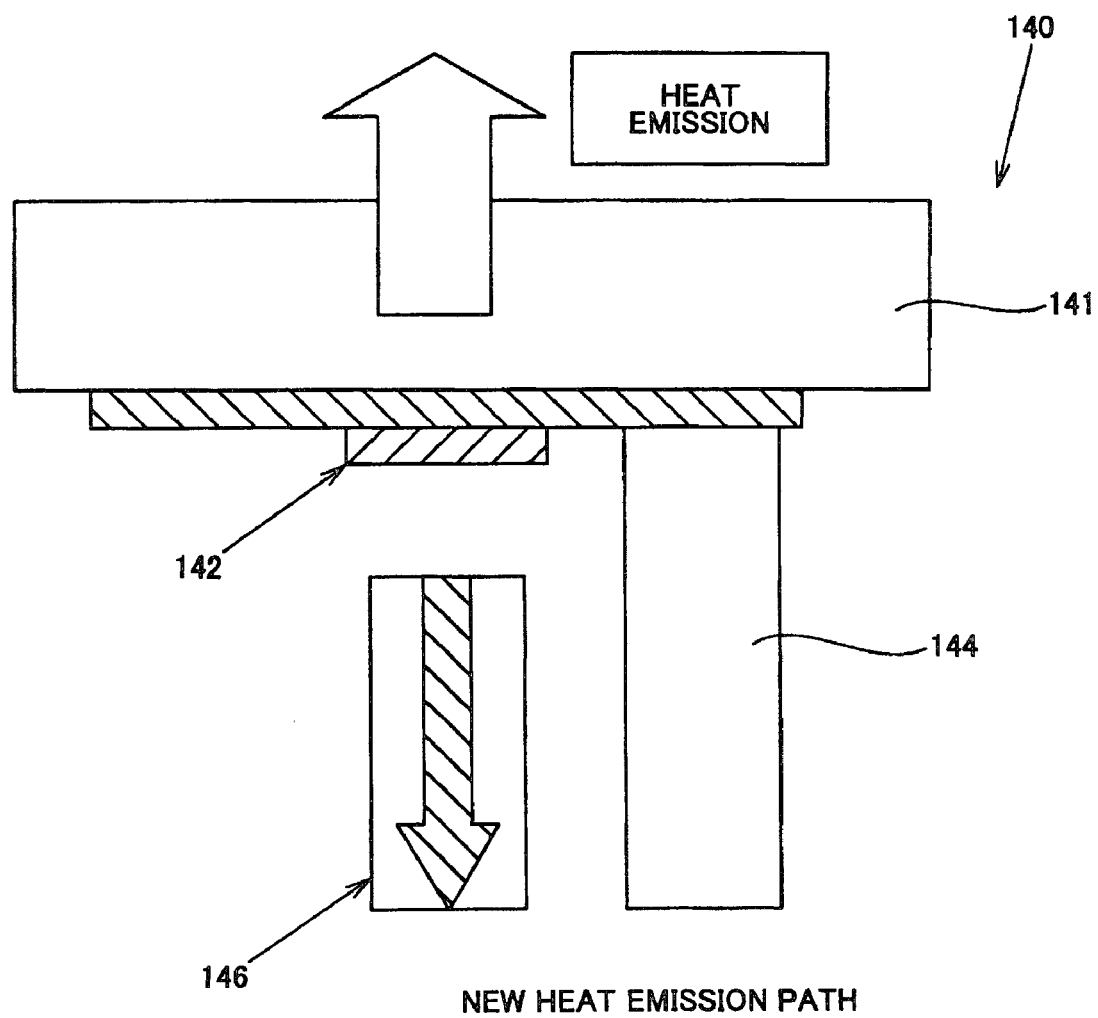
FIG. 5 is a schematic sectional view for explaining a heat radiation effect of the LSI chip shown in FIG. 3.
Figure 8:
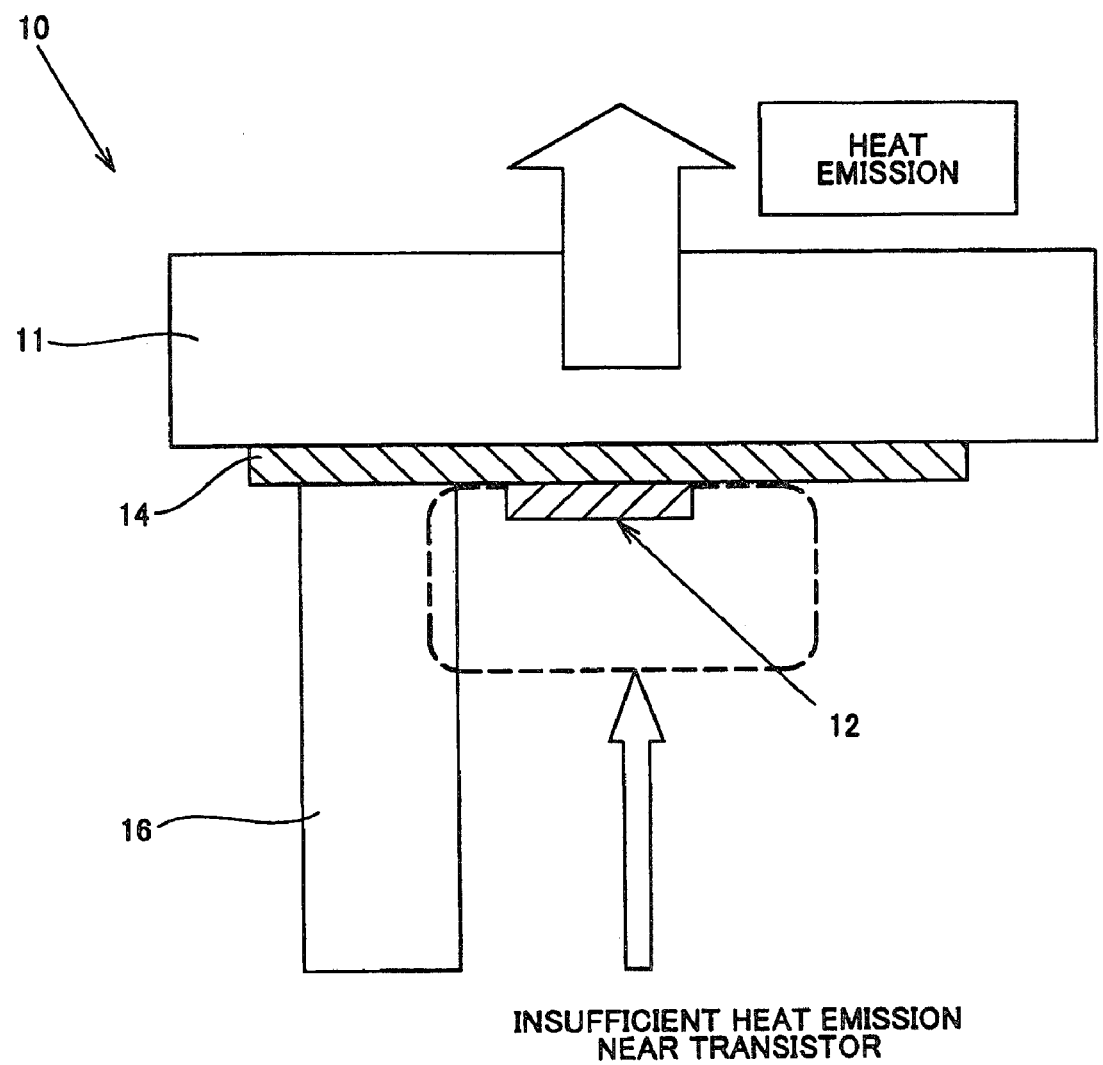
FIG. 8 is a schematic sectional view for explaining the heat radiation effect of the LSI chip shown in FIG. 7.

In the LSI chip 140, the heat radiation wires 146 provided between the wiring layers 145a and 145b radiate heat from the transistors 142. Since the LSI chip has a new heat emission path as shown by an oblique arrow in FIG. 5, the heat radiation efficiency is higher than that of the conventional LSI chip shown in FIG. 8. This configuration can therefore protect the transistors 142 from thermal damages, and maintain their electric characteristics. The LSI chip 140 can use a Law-k interlayer film material and a higher operational frequency.

The signal wires 144 and the heat radiation wires 146 are connected to different bumps 148. In this case, the bumps 148 serve as heat exhaust port. Use of the bumps 148 that are inherently provided in the LSI chip 140 can prevent the increased number of components and maintain the size of the chip 140.

The heat radiation wire 146 is made of a metallic material having a high thermal conductivity, such as cupper and aluminum. When the heat radiation wire 146 is made of the same material as that of the signal wire 144, the same machine can form both the signal wires 144 and the heat radiation wires 146 as dummy wires. Of course, the heat radiation wire 146 may be made of a dedicated material different from the signal wire 144.

The heat radiation wire 146 may have the same diameter as that of the signal wire 144. It is conceivable to make a diameter of the heat radiation wire 146 greater than that of the signal wire 144 so as to enhance the heat radiation efficiency, but this configuration would increase the size of the chip 140. However, the present invention allows the diameter of the heat radiation wire 146 to be greater than the signal wire 144, when the large size of the chip 140 is permissible or when the enhanced heat radiation efficiency is highly required.

Figure 4:
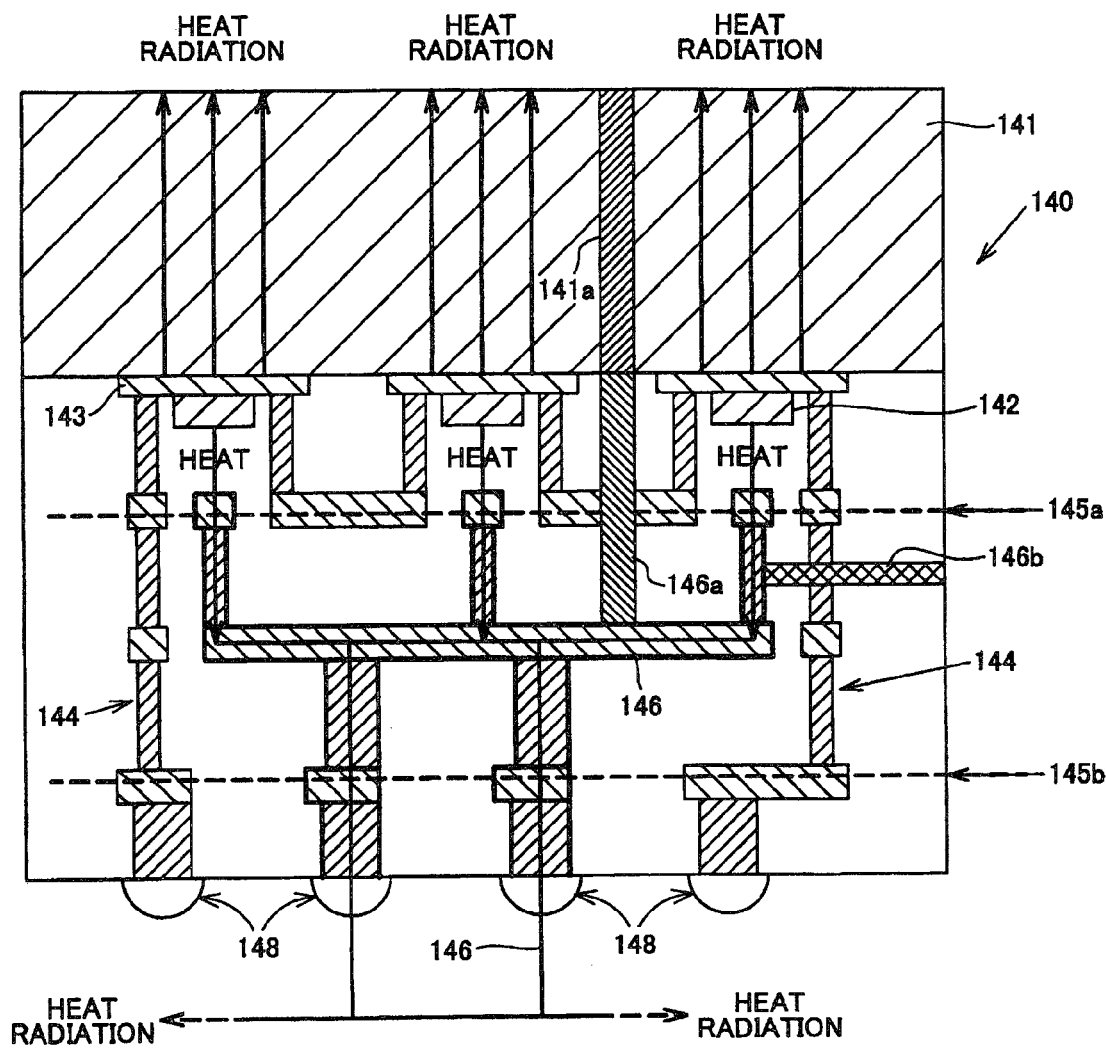
FIG. 4 is a schematic enlarged sectional view of a variation of the LSI chip shown in FIGS. 2A-2C.

The heat exhaust port of the heat radiation wire 146 is not limited to the bump 148. For example, the heat radiation wire 146 may further include a heat radiation wire 146a that is connected to a heat conducting member 141a that perforates the substrate 141, as shown in FIG. 4. Thereby, the heat from the heat radiation wire 146 is transmitted to the heat spreader 130. The heat conductor 141a is made of the above material having the high thermal conductivity. Moreover, the heat radiation wire 146 may extend perpendicular to a lamination direction of the signal wires 144 and expose to the outside, like a heat radiation wire 146b. Although FIG. 4 shows the signal wire 144 and the heat radiation wire 146 on the same plane, the signal wire 144 does not contact any heat radiation wire 146a or 146b. Thus, the heat radiation wire 146 can be taken out from an arbitrary position of the LSI chip 140. The package 120 may further include a member configured to radiate heat from the taken-out part of the heat radiation wire. The heat radiation member may use natural cooling, such as a heat sink, or compulsory cooling, such as a heat pipe and a cooling fan.

Figures 6A, 6B:
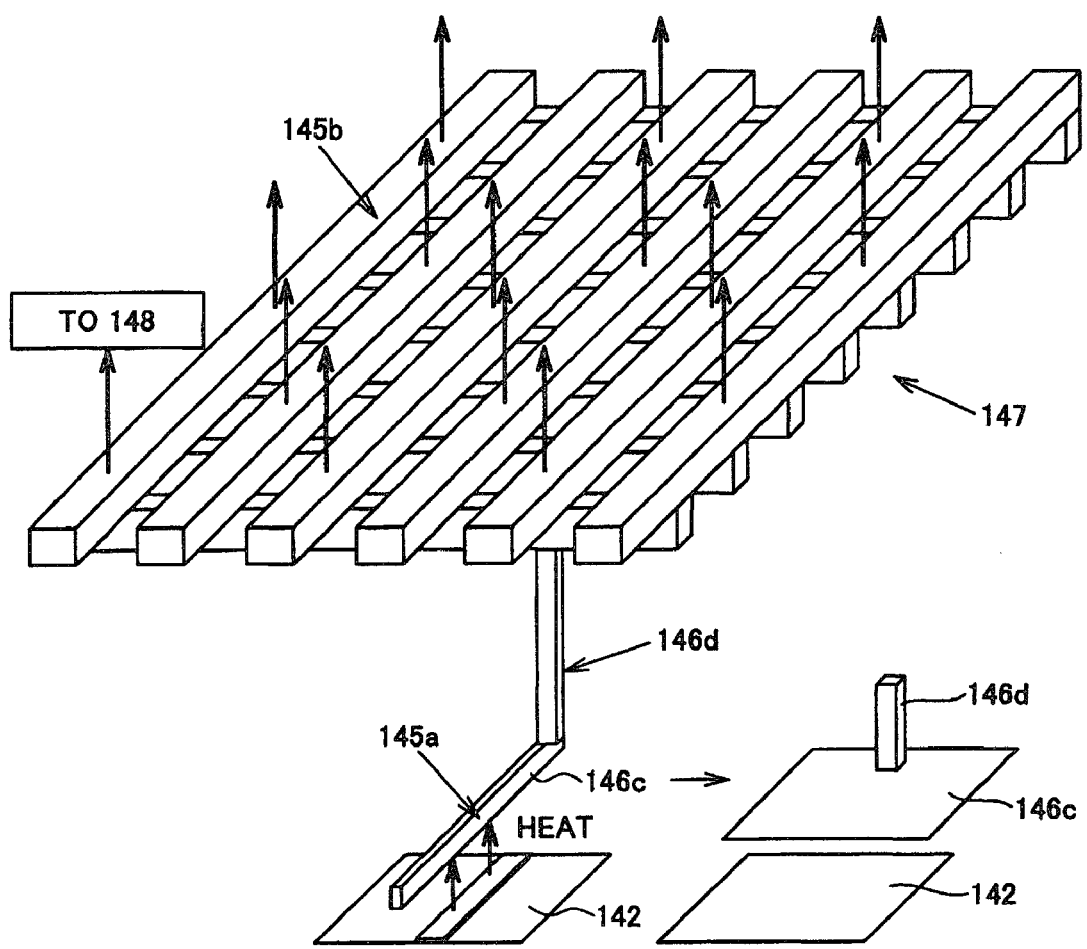
FIG. 6A is a schematic enlarged perspective view of a meshed member applicable to the LSI chip shown in FIG. 5.
FIG. 6B is a partial perspective view of a variation of FIG. 6A.
Figure 7:
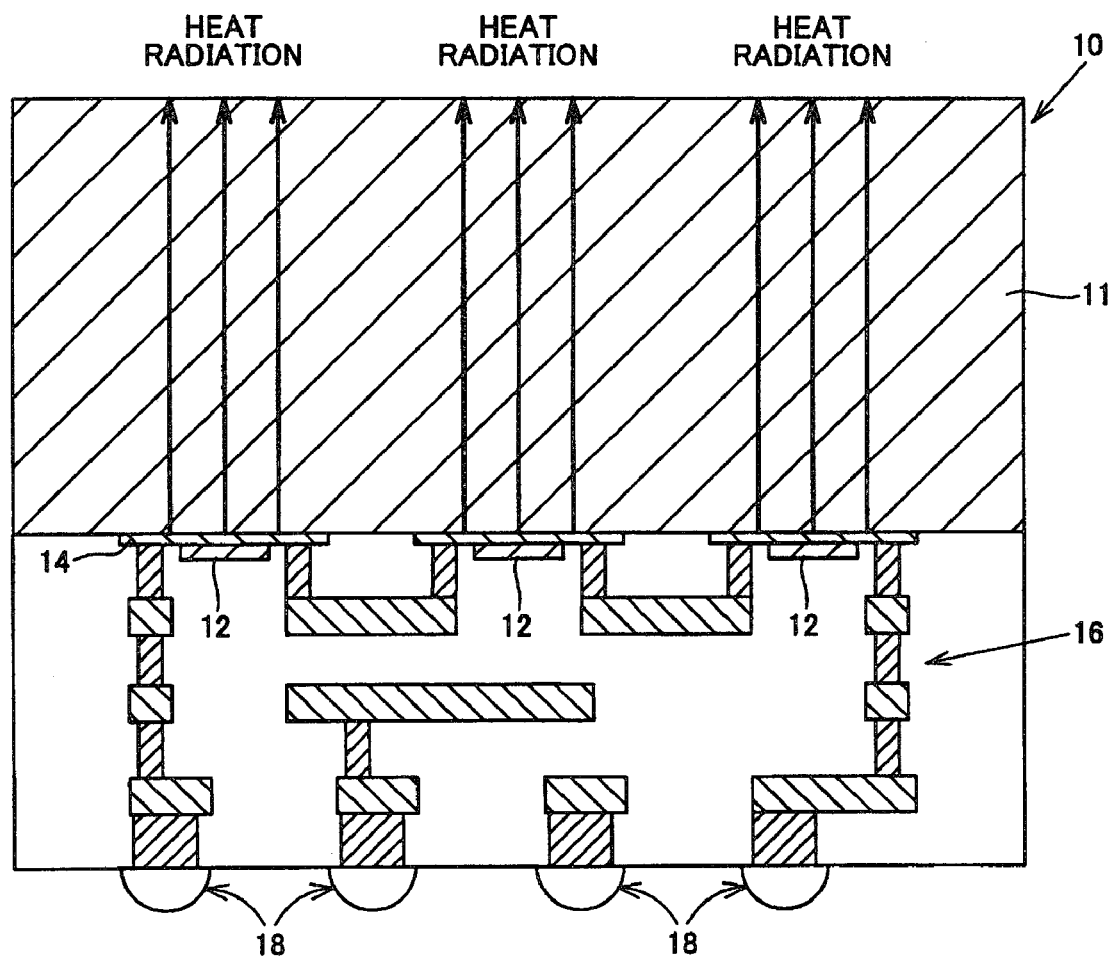
FIG. 7 is a schematic enlarged sectional view of a conventional LSI chip.

The heat radiation wire 146 may have a meshed member 147 in the uppermost wiring layer 145b or a wiring layer near the uppermost wiring layer 145b. FIG. 6A is a schematic enlarged perspective view of the meshed member 147. The meshed member 147 has an effect of uniformly dispersing the locally generated heat in the LSI chip 140. As long as the heat dispersion effect is maintained, the mesh shape is not necessarily required.

As shown in FIG. 6A, the heat radiation wire 146 includes a part 146c that is spaced from the transistor 142, and extends parallel to the surface of the transistor 142. Spacing from the transistor 142 can prevent the heat radiation wire 146 from deteriorating the electric characteristic of the transistor 142. A parallel arrangement to the surface of the transistor 142 rather than a perpendicular arrangement to the surface of the transistor 142 enables the heat radiation wire 146 to uniformly receive the heat from the transistor 142 in a direction in which the heat radiation wire 146c extends.

As shown in FIG. 6A, the heat radiation wire 146c in the uppermost wiring layer 145a above the transistor 142 absorbs the heat generated around the transistor 142, and transmits the heat to the uppermost wiring layer 145b. A connecting line 146d from the uppermost wiring layer 145a to the meshed member 147 can be sufficiently made with a minimum critical dimension of the technology to be used. A thickness of the upper mesh depends upon a mask design rule concerning connections with the bumps 148.

As shown in FIG. 6B, when the part 146c has a plate 146e parallel to the surface of the transistor 142, the part 146c can uniformly receive the heat from the whole surface of the transistor 142. The mesh structure permits the signal wires to pass through it, and a plate may be used instead of the mesh in an area that has no signal wires.

Furthermore, the present invention is not limited to these embodiments and various variations and modifications may be made without departing from the scope of the present invention. For example, the electronic apparatus of the present invention is not limited to the rack-mount type server, but is applicable to a bookshelf type. In addition, the electronic apparatus of the present invention is not limited to a server, but is applicable to a personal computer, a network device, a cellular phone, a PDA, and another peripheral. The present invention is applicable to an exoergic circuit element that does not serve as a CPU, such as a chipset.

What is claimed is:

1. An electronic device comprising:
    a circuit element that transmits a signal to an external board and receives the signal from the external board;
    a plurality of wiring layers;
    a signal wire that is formed in the wiring layers, and connects the external board to the circuit element; and a heat radiation wire that thermally contacts the circuit element, radiates heat from the circuit element, and includes a part that is spaced from the circuit element and extends parallel to a surface of the circuit element, the heat radiation wire and the part being located in the wiring layers; and a dispersion member that is located in the wiring layer and connected to the heat radiation wire, and disperses heat from the heat radiation wire.

2. An electronic device according to claim 1, wherein the heat radiation wire is electrically isolated from the circuit element.

3. An electronic device according to claim 1, further comprising a bump that is connectible to the external board, wherein the heat radiation wire is thermally connected to the bump.

4. An electronic device according to claim 3, further comprising plural bumps that are connectible to the external board, wherein the signal wire and the heat radiation wire are connected to different bumps among the plural bumps.

5. An electronic device according to claim 1, wherein the dispersion member is formed in a wiring layer farthest from the circuit element among wiring layers of the signal wire.

6. An electronic device according to claim 1, further comprising:

a substrate that is mounted with the circuit element opposite to the wiring layers with respect to the circuit element, and radiates heat from the circuit element; and a heat conductor that perforates the substrate, and is connected to the heat radiation wire.

7. An electronic device according to claim 1, wherein the heat radiation wire extends perpendicular to a lamination direction of the signal wire, and exposes to outside.

8. A circuit package comprising:

an electronic device that includes a circuit element, a plurality of wiring layers, a signal wire that is formed in the wiring layers and connects an external board to the circuit element, and a heat radiation wire that thermally contacts the circuit element, radiates heat from the circuit element, and includes a part that is spaced from the circuit element and extends parallel to a surface of the circuit element, the heat radiation wire and the part being located in the wiring layers;

a substrate that is mounted with the circuit element, and electrically connected to the circuit element;

a pin provided onto the substrate and electrically connected to the external board; and a dispersion member that is located in the wiring layers and connected to the heat radiation wire, and disperses heat from the heat radiation wire.

9. A circuit package according to claim 8, further comprising a heat conductor that is thermally connected to the electronic device, and leads the heat that is generated from the electronic device to outside.

10. An electronic apparatus comprising:

an electronic device that includes a circuit element, a plurality of wiring layers, a signal wire that is formed in the wiring layers and electrically connects an external board to the circuit element, and a heat radiation wire that radiates heat generated from the circuit element and includes a part that is spaced from the circuit element and extends parallel to a surface of the circuit element, the heat radiation wire and the part being located in the wiring layers;

a circuit board mounted with and electrically connected to the electronic device; and a dispersion member that is located in the wiring layers and connected to the heat radiation wire, and disperses heat from the heat radiation wire.

* * * * *